(12) United States Patent
Wakchaure et al.

(10) Patent No.: US 9,490,018 B2
(45) Date of Patent: Nov. 8, 2016

(54) EXTENDED SELECT GATE LIFETIME

(71) Applicant: Intel Corporation, Santa Clara, CA (US)

(72) Inventors: Yogesh B. Wakchaure, Folsom, CA (US); Kiran Pangal, Fremont, CA (US); Xin Guo, San Jose, CA (US); Qingru Meng, San Jose, CA (US); Hanmant P. Belgal, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/679,574

(22) Filed: Apr. 6, 2015

(65) Prior Publication Data

US 2015/0213900 A1    Jul. 30, 2015

Related U.S. Application Data

(62) Division of application No. 14/549,785, filed on Nov. 21, 2014, now Pat. No. 9,030,885, which is a division of application No. 14/313,155, filed on Jun. 24, 2014, now Pat. No. 8,929,151, which is a division of application No. 13/528,966, filed on Jun. 21, 2012, now Pat. No. 8,792,283.

(51) Int. Cl.
*G11C 16/16* (2006.01)
*G11C 16/14* (2006.01)
(Continued)

(52) U.S. Cl.
CPC .......... *G11C 16/14* (2013.01); *G11C 16/0483* (2013.01); *G11C 16/06* (2013.01);
(Continued)

(58) Field of Classification Search
CPC ..... G11C 16/16; G11C 16/10; G11C 16/102; G11C 16/26; H01L 27/115
USPC .................. 365/185.33, 185.29, 228, 185.17
See application file for complete search history.

(56) References Cited

U.S. PATENT DOCUMENTS

| | | | |
|---|---|---|---|
| 7,379,335 B2 * | 5/2008 | Futatsuyama | G11C 16/0483 365/185.17 |
| 2007/0091688 A1 | 4/2007 | Pabustan et al. | |

(Continued)

FOREIGN PATENT DOCUMENTS

| | | |
|---|---|---|
| CN | 1111825 A | 11/1995 |
| CN | 101174470 A | 5/2008 |
| CN | 104321822 A | 1/2015 |
| WO | 2013/191898 A1 | 12/2013 |

OTHER PUBLICATIONS

International Preliminary Report on Patentalility received for International Application No. PCT/US2013/044155, mailed on Dec. 31, 2014.

(Continued)

*Primary Examiner* — Jason Lappas
(74) *Attorney, Agent, or Firm* — Thorpe North & Western

(57) ABSTRACT

A flash memory device may include two or more flash memory cells organized as a NAND string in a block of flash memory cells, and flash cells, coupled to the NAND string at opposite ends, to function as select gates. The flash memory device may be capable of providing information related to a voltage threshold of the select gates to a flash controller, erasing the flash cells that function as select gates in response to a select gate erase command, and programming the flash cells that function as select gates in response to a select gate program command. A flash controller may be coupled to the flash memory device, and is capable of sending the select gate erase commend to the flash memory device if the information provided by the flash memory device indicates that the voltage threshold of at least one of the select gates is above a predetermined voltage level, and sending the select gate program command to the flash memory device if the information provided by the flash memory device indicates that the voltage threshold of at least one of the select gates is outside of a predetermined voltage range.

15 Claims, 7 Drawing Sheets

(51) Int. Cl.
    *G11C 16/06*     (2006.01)
    *G11C 16/04*     (2006.01)
    *G11C 16/34*     (2006.01)
    *G11C 16/10*     (2006.01)
    *G11C 29/02*     (2006.01)
    *G11C 16/26*     (2006.01)
    *H01L 27/115*     (2006.01)

(52) U.S. Cl.
    CPC ............ *G11C 16/10* (2013.01); *G11C 16/102* (2013.01); *G11C 16/16* (2013.01); *G11C 16/3418* (2013.01); *G11C 16/3445* (2013.01); *G11C 29/028* (2013.01); *G11C 16/26* (2013.01); *H01L 27/115* (2013.01)

(56) References Cited

U.S. PATENT DOCUMENTS

| | | |
|---|---|---|
| 2007/0230247 A1 | 10/2007 | Hsu et al. |
| 2008/0181020 A1 | 7/2008 | Yu et al. |
| 2008/0298130 A1 | 12/2008 | De Santis et al. |
| 2009/0201742 A1 | 8/2009 | Lee et al. |
| 2009/0316491 A1 | 12/2009 | Park et al. |

OTHER PUBLICATIONS

International Search Report and Written Opinion received for PCT Patent Application No. PCT/US2013/044155, mailed on Sep. 6, 2013, 12 pages.

\* cited by examiner

EXTENDED SELECT GATE LIFETIME

CROSS-REFERENCE TO RELATED APPLICATIONS

The present application is a divisional of U.S. application Ser. No. 14/549,785 filed Nov. 21, 2014 (pending), which in turn is a divisional of U.S. application Ser. No. 14/313,155 filed Jun. 24, 2014, now U.S. Pat. No. 8,929,151, which in turn is a divisional of U.S. application Ser. No. 13/528,966 filed Jun. 21, 2012, now U.S. Pat. No. 8,792,283. Said application Ser. Nos. 14/549,785, 14/313,155, and 13/528,966 are hereby incorporated herein by reference in their entireties.

BACKGROUND

1. Technical Field

The present subject matter relates to semiconductor memory devices, and, more particularly, to NAND flash memory devices using flash cells as select gates.

2. Background Art

Many types of semiconductor memory are known in the art. Some memory is volatile and will lose its contents if power is removed. Some memory is non-volatile and will hold the information stored in the memory even after power has been removed. One type of non-volatile memory is flash memory which stores charge in a charge storage region of a memory cell. In a floating gate flash cell, a conductive floating gate, positioned between the control gate and the channel of a metal-oxide silicon field-effect transistor (MOSFET), is used to store a charge. In a charge trap flash (CTF) cell, a layer of non-conductive material, such as a nitride film, is used to store charge in a MOSFET. The voltage threshold of the MOSFET-based flash cell can be changed by changing the amount of charge stored in the charge storage region of the cell, and the voltage threshold can be used to indicate a value that is stored in the flash cell.

One architecture in common use for flash memories is a NAND flash architecture. In a NAND flash architecture, two or more flash cells are coupled together, source to drain, into a string, with the individual cell control gates coupled to control lines, such as word lines. Select gates, which have traditionally been standard MOSFETs, may be coupled to the NAND string at either end, to couple the NAND string to a source line at one end of the NAND string, and to a bit line at the other end of the NAND string. The voltage threshold to turn on the select gates may impact operation of the NAND flash memory. If the voltage threshold of the select gates is too high or too low, the NAND string may not be properly erased, programmed, and/or read, or may interfere with access of other NAND strings.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

Figure 1A:
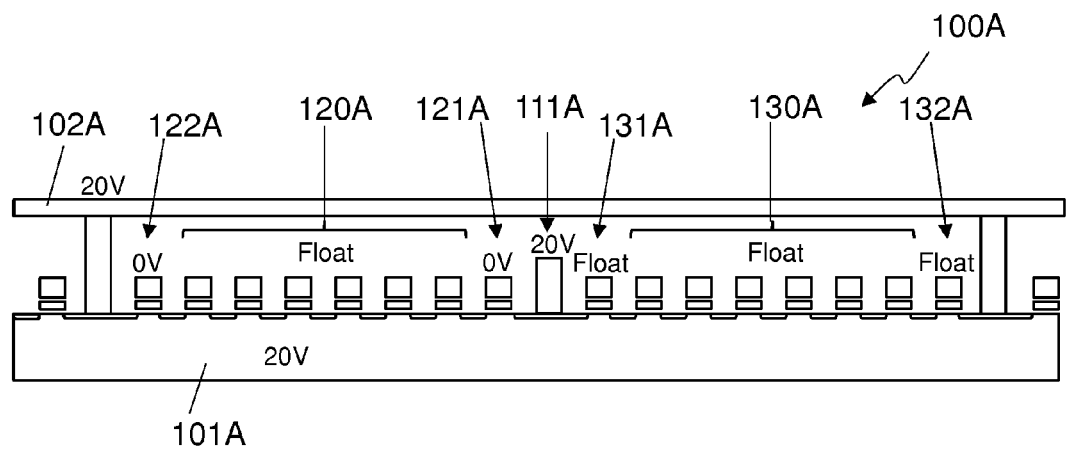
FIG. 1A is a diagram showing voltages for a select gate erase operation of a NAND flash device that uses flash cells as select gates.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification.

As process technology evolves to smaller and smaller geometries, it may become more difficult to fabricate the select gate transistors of a NAND flash memory device as standard MOSFETs. To facilitate process integration of high density NAND flash devices, the select gates may be fabricated as flash cells instead of standard MOSFETs. In some embodiments, such as those shown later in this disclosure, the flash cells used as select gates may be floating gate transistors (FGT), but other embodiments may utilize charge trap flash (CTF) transistors or some other type of transistor that includes a charge storage region as the flash cells used as select gates. A flash cell may refer to any device capable of storing a charge and have a voltage threshold for switching that may be affected by the amount of charge stored.

If a transistor with a charge storage region is used as a select gate, the amount of charge stored in the charge storage region of the select gate determines the voltage threshold of the select gate. Various operations to the flash memory may impact the amount of charge stored in the select gates. At least two mechanisms may cause significant changes to the amount of stored charge over time, read disturbance and drain disturbance.

Read disturbances of the charge stored in the select gates (SGs) may occur as the block which includes the select gates is read. During reads, the SGs in the block being read may be biased with a positive gate voltage to turn on the NAND strings being read. The positive gate voltage weakly biases the charge storage region, which may cause a charge gain from stress induced leakage current (SILC). The charge gain from a large number of reads over time may cause the voltage threshold of the SGs to rise above a value where the SGs can be fully turned on to read their attached NAND string.

Drain disturbances may occur in unselected blocks during program operations. The control gate of the SGs of unselected blocks may be held to ground or some other low voltage during programming, but the source and/or drain of the FGTs used as the SGs may be at Vcc or some other voltage significantly above the voltage of the control gate. This may cause a loss of charge from the charge storage region of the SGs which may lower the voltage threshold of the FGTs. If the voltage threshold gets too low, it may not be possible to reliably turn off the SGs of unselected NAND strings during a read, which may prevent another NAND string coupled to the same bit line from being read reliably.

If the SGs are not refreshed by performing erase and/or program operations on the SGs, over time, the voltage thresholds of the SGs may drift outside of a specified range. But traditional flash memories do not provide any mechanism for erasing and/or programming SGs. If a flash memory were to use flash cells as SGs it might include test modes where the SGs may be erased and/or programmed during a manufacturing test process to initially set the voltage threshold but provide no mechanism to refresh the voltage threshold of a SG during normal operation over lifetime of the flash memory device. Using such a device, if during normal operation, which may be defined as operating the flash memory device after it has been packaged and is operated using only the externally accessible leads on the flash memory device in an electronic system, such as the electronic system shown in FIG. 3, the voltage threshold of a SG drifts outside of the specified range, the block of memory that includes that SG may be retired. Such early retirements may reduce the reliability or lifetime of the flash memory device. So by providing erase and program operations for the SGs of a flash memory device, the reliability and/or lifetime of the flash memory device may be increased.

Reference now is made in detail to the examples illustrated in the accompanying drawings and discussed below. Certain voltage levels may be discussed for the embodiments below that may vary dramatically from the voltage levels used by other embodiments. The specific voltage levels discussed are approximate and are meant to be an example only. Other embodiments may use any voltage levels appropriate for the technology. The timing of the various operations may vary widely among embodiments and is not discussed here. One skilled in the art may determine appropriate voltage levels and timing parameters to apply for a given technology and the exact voltage levels and timing do not impact the concepts discussed herein.

FIG. 1A is a diagram showing voltages for a select gate erase operation of a NAND flash device 100A that uses flash cells as NAND select gates 121A, 122A, 131A, 132A. The diagram is a cross-sectional view of a small portion of the NAND flash device 100A that includes two NAND flash strings 120A, 130A. Floating gate transistors (FGTs), such as the select gates 121A, 122A, 131A, 132A, and the FGTs of the NAND flash strings 120A, 130A are built on a substrate 101A, which in some embodiments may be made of p-doped silicon (Si). A bit line 102A, that runs parallel with the page, and a source line 111A, that runs perpendicular to the page, may be included. The select gates 121A, 122A of the first NAND string 120A are being erased in FIG. 1A and a second NAND string 130A, in a different block, is inhibited so that its select gates 131A, 132A are not changed.

In an erase operation the substrate 101A is driven to a relatively high voltage, such as about 20 volts (V) for some technologies. With the substrate 101A at a positive voltage, the source line 111A and the bit line 102A may be at a similar voltage to avoid creating forward biased p-n junctions in the n-doped wells where the source line 111A and bit line 102A contact the substrate 101A. To avoid having a large reverse bias applied to its floating gates to erase the second NAND string 130A, the control gates of the FGTs of the second NAND string 130A and the control gates of the select gate source (SGS) 131A and the select gate drain (SGD) 132A are not driven and are allowed to float. The floating control gates may then capacitively couple to the substrate 101A to float to almost the same voltage as the substrate 101A, or almost 20V, so little bias is applied to the charge storage region of the flash cells of the second NAND string 130A, the SGS 131A, or the SGD 132A. Since little bias is applied to the FGTs, the charge stored in the charge storage region, and therefore the voltage threshold of the FGTs, is unchanged.

The select gate erase operation shown in FIG. 1A sets the voltage threshold of the SGS 121A and the SGD 122A to a low voltage by applying a relatively large reverse bias across the charge storage region of the SGS 121A and the SGD 122A. This may be referred to as erasing the SGS 121A and the SGD 122A. A low voltage, such as ground, may be applied to the control gates of SGS 121A and SGD 122A while the substrate 102A is at a high voltage, such as 20V, to generate the relatively large reverse bias to erase SGS 121A and SGD 122A. In at least one embodiment, the voltage threshold of SGS 121A and SGD 122A may be 0 volts or less after the SG erase operation is completed. The control gates of the FGTs of the first NAND string 120A are allowed to float during the SG erase operation so that they can capacitively couple to the substrate 101A and apply little or no electric field across their charge storage regions. By doing this, the SG erase operation may not change the charge stored in, and therefore not change the state of, the first NAND string 120A.

Various embodiments may use a variety of techniques to ensure that at least one bit in the first NAND string 120A is programmed before erasing SGS 121A and SGD 122A. If the entire first NAND string 120A is erased, and SGS 121A and SGD 122A are both erased, current may flow through the NAND string 120A even if the control gates of the NAND string 120A and SGS 121A and SGD 122A are at ground. This may cause errors to accesses of other NAND strings coupled to bit line 102A.

Figure 1B:
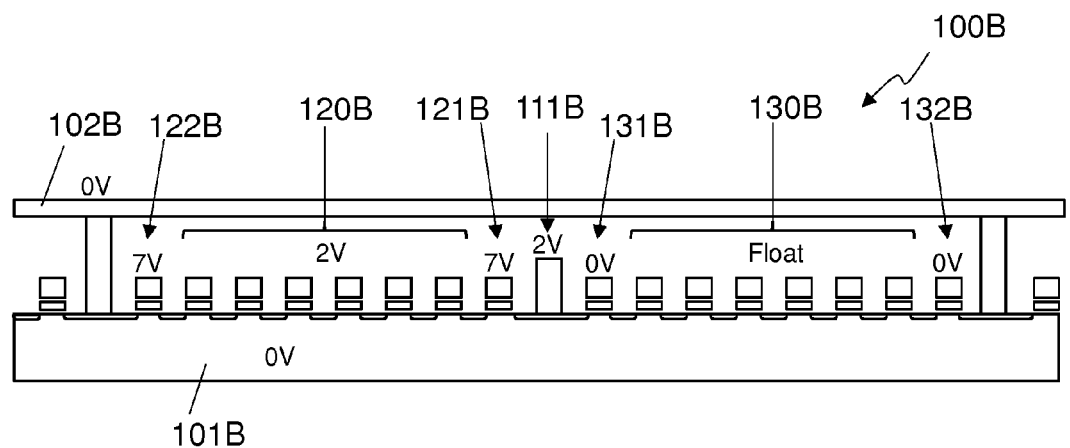
FIG. 1B is a diagram showing voltages for a select gate program operation of a NAND flash device that uses flash cells as select gates.

FIG. 1B is a diagram showing voltages for a select gate program operation of a NAND flash device 100B that uses flash cells as select gates 121B, 122B, 131B, 132B. The diagram is a cross-sectional view of a small portion of the same NAND flash device 100A as shown in FIG. 1A, but with voltages to perform the select gate program operation instead of the select gate erase operation. The NAND flash device 100B includes the substrate 101B at about ground, the bit line 102B at about ground, and the select line 111B at about 2 V. The select gates 121B, 122B of the first NAND string 120B are being programmed in FIG. 1B and a second NAND string 130B is inhibited by floating the control gates of the second NAND string 130B and driving the control gates of SGS 131B and SGD 132B to about ground so that little if any electric field is applied across their charge storage regions. Thus the SGS 131B and SGD 132B are not changed.

The select gate program operation is designed to set the voltage threshold of the SGS 121B and the SGD 122B, that are coupled to the first NAND string 120B, to a predetermined value. This may be accomplished by applying a relatively high electric field across the charge storage region of the FGTs used for the SGS 121B and SGD 122B. In the embodiment shown, about 7V is applied to the control gates of SGS 121B and SGD 122B which may set the voltage threshold of SGS 121B and SGD 122B to about 1.5 V, or within a range of about 1 V to about 2 V. Some embodiments may use a different voltage on the control gate of SGS 121B than the voltage used on the control gate of SGD 122B and may set different threshold voltages on the two different select gates. A voltage may be applied to the control gates of the first NAND string 120B to minimize stress on the charge storage region, such as about 2 V, but other embodiments may use any voltage, as the first NAND string 120B may be either conducting or non-conducting during the select gate program operation.

Figure 1C:
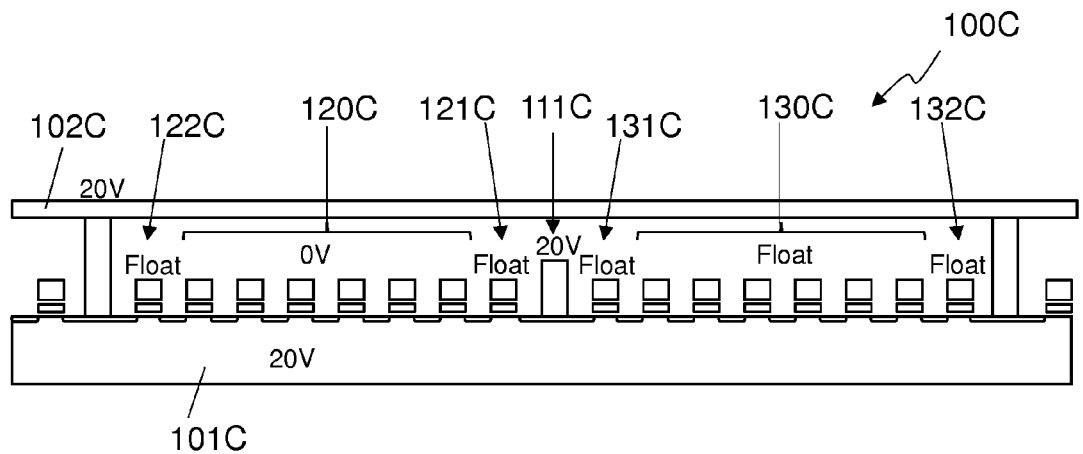
FIG. 1C is a diagram showing voltages for a block erase operation of a NAND flash device that uses flash cells as select gates.

FIG. 1C is a diagram showing voltages for a block erase operation of a NAND flash device 100C that uses flash cells as select gates 121C, 122C, 131C, 132C. The diagram is a cross-sectional view of a small portion of the same NAND flash device 100A as shown in FIG. 1A, but with voltages to perform the block erase operation instead of the select gate erase operation. The NAND flash device 100C includes the substrate 101C at about 20 V, the bit line 102C at about 20 V, and the select line 111C at about 20 V. The first NAND string 120C is being erased in FIG. 1C and a second NAND string 130C is inhibited by floating the control gates of the NAND string 130C and select gates 131C, 132C so that they are not changed.

The control gates of the FGTs of the first NAND string 120C may be held to about ground to generate a high reverse electric field across the charge storage regions of the FGTs due to the about 20 V applied to the substrate. The high reverse electric field may bring the voltage threshold of the FGTs of the first NAND string 120C to a low level, such as about 0 volts or less. The control gates of SGS 121C and SGD 122C may be allowed to float so that capacitive coupling to the substrate 101C may bring the control gates to about 20 V. This minimizes any electric field across the charge storage regions of SGS 121C and SGD 121C so that their voltage thresholds are not impacted.

Figure 1D:
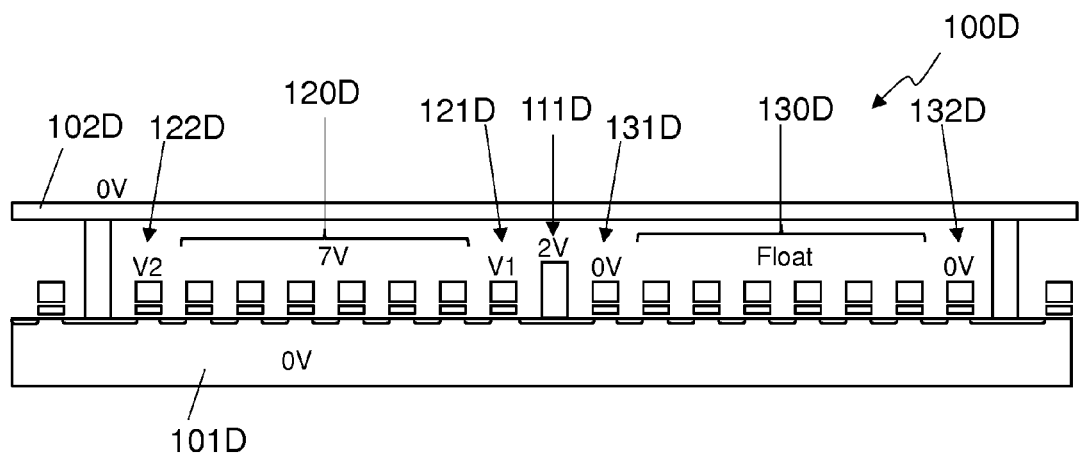
FIG. 1D is a diagram showing voltages for a select gate voltage threshold check operation of a NAND flash device that uses flash cells as select gates.

FIG. 1D is a diagram showing voltages for a select gate voltage threshold check operation of a NAND flash device 100D that uses flash cells as select gates 121D, 122D, 131D, 132D. The diagram is a cross-sectional view of a small portion of the same NAND flash device 100A as shown in FIG. 1A, but with voltages to perform the select gate voltage threshold check operation instead of the select gate erase operation. The NAND flash device 100D includes the substrate 101D at about ground, the bit line 102D at about ground, and the select line 111D at about 2 V. The SGS 131D and SGD 132D of the second NAND string 130D are turned off by having the select gates of SGS 131D and SGD 132D at about ground, and the select gates of the FGTs of the second NAND string floating, to ensure that no current is flowing through the second NAND string 130D to the bit line 102D that might interfere with reading a bit of the first NAND string 120D.

Several read operations may be performed as a part of the select gate voltage threshold check. In the embodiment shown, the maximum voltage threshold of the FGTs of the first NAND string 120D is about 5.5 V, so by applying a voltage of about 7 volts to the control gates their control gates, the FGTs of the first NAND string 120B may be turned on regardless of the data programmed into the individual cells. A first pair of reads may be performed with a voltage on the control gate of the SGD 122D, V2, at about 2.5 V, so that SGD 122D is reliably turned on. A read is performed with a voltage on the control gate of the SGS 121D, V1, equal to the lowest allowable voltage threshold, which may be about 0.7 V in some embodiments, although some embodiments may add a guardband and set V1=about 0.5 V for the read. If the voltage threshold of SGS 121D is equal to or greater than the specified minimum of 0.7 V, the first NAND string 120D will not conduct and the read will behave as if reading a programmed cell. If the read behaves as if it were reading an erased cell with current flowing through the first NAND string 120D, the voltage threshold of SGS 121D is too low. The second read may set a voltage on the control gate of the SGS 121D, V1 equal to the highest allowable voltage threshold, which may be about 2.1 V plus a guardband and set V1=about 2.3 V. If the voltage threshold of SGS 121D is equal to or less than the specified maximum of 2.1 V, the first NAND string 120D will conduct and the read will behave as if reading an erased cell. If the read behaves as if it were reading a programmed cell, with no current flowing through the first NAND string 120D, the voltage threshold of SGS 121D is too high.

A similar pair of reads may also be performed to determine if the voltage threshold of the SGD 122D is within its specified range. To check the voltage threshold of SGD 122D, the control gate of SGS 121D is set to a value, such as about 2.5 V, to allow the SGS 121D to conduct. The voltage threshold specifications for SGD 122D may be the same or different than the voltage threshold specifications for SGS 121D. Reads may then be performed with the control gate of SGD 122D, V2=minimum voltage threshold−guardband and V2=maximum voltage threshold+guardband. Similarly, by checking the read values of the two reads, it can be determined if the voltage threshold of SGD 122D is too high, too low, or within its specified range. Other embodiments may combine the 4 reads into fewer operations and some embodiments may use more reads. Additional operations may also be performed to ensure that the first NAND string is properly erased in various embodiments. Some embodiments may also perform a block program operation if it is determined that one of the select gate threshold voltages is too low.

Figure 1E:
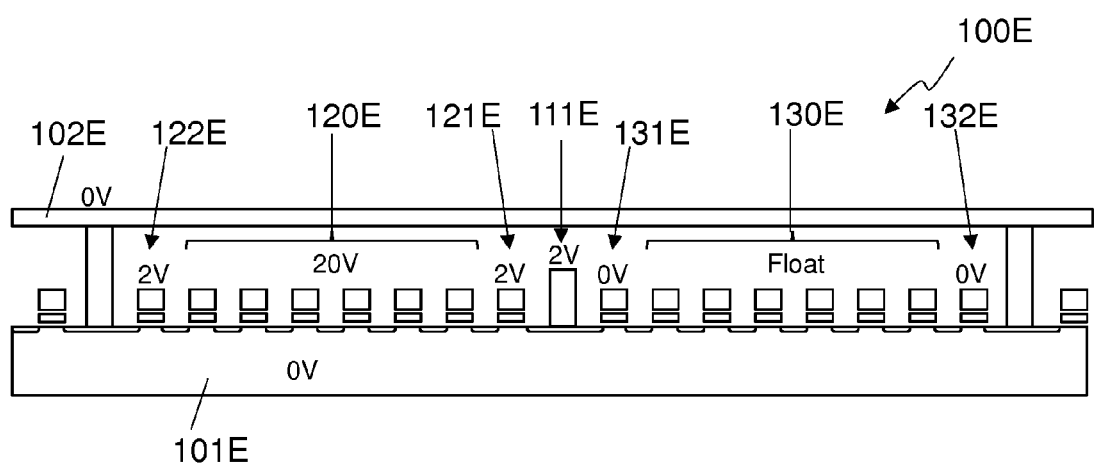
FIG. 1E is a diagram showing voltages for a block program operation of a NAND flash device that uses flash cells as select gates.

FIG. 1E is a diagram showing voltages for a block program operation of a NAND flash device 100E that uses flash cells as select gates 121E, 122E, 131E, 132E. The diagram is a cross-sectional view of a small portion of the same NAND flash device 100A as shown in FIG. 1A, but with voltages to perform the block program operation instead of the select gate erase operation. The NAND flash device 100E includes the substrate 101E at about ground, the bit line 102E at about ground, and the select line 111E at about 2 V. The first NAND string 120E is being programmed in FIG. 1C and a second NAND string 130C is inhibited by floating the control gates of the FGTs of the NAND string 130C so that it is not changed. The control gates of SGS 131E and SGD 132E may be held at ground to minimize any electric field across their charge storage regions.

The intent of the block program operation is to program the cells of a block of NAND strings so that they can reliably be turned off by holding the word lines that are coupled to the select gates of the FGTs to about ground. To accomplish this for a block including the first NAND string 120E, the select gates of the FGTs of the NAND string 120E may be driven to a program voltage, such as about 20V. This applies a forward electric field across the charge storage region of the FGTs to set their voltage threshold to a positive voltage, such as about 5.5 V. The control gates of the SGS 121E and SGD 122E may be set to a voltage to limit the electric field across their charge storage regions and may be a voltage such as about 2 V, but other embodiments may use any voltage as it is not important whether the select gates 121E, 122E are conducting or not during the block program operation.

Other embodiments may implement the select gate erase command, the select gate program command, the block erase command, the select gate voltage threshold check, and the block program command differently than described above. Other techniques and combinations of voltages on various control lines for different lengths of time may be used and some embodiments may split any one of the operations described above into multiple operations and/or combine multiple operations described above into a single operation. Any operation that sets the voltage threshold of the select gates to a low value may be considered a select gate erase operation. Any operation that sets the voltage threshold of the select gates to a known level above the low value set by the select gate erase operation may be considered a select gate program operation. Any operation that sets the voltage threshold of two or more of memory cells in a string to a low value may be considered a block erase operation. Any operation that allows for the voltage threshold of one or more select gates to be compared against one or more predetermined values may be considered a select gate voltage threshold check operation. And any operation that sets the voltage threshold of two or more of memory cells in a string to a higher value than the low value set by the block erase command may be considered a block program operation.

Figure 2:
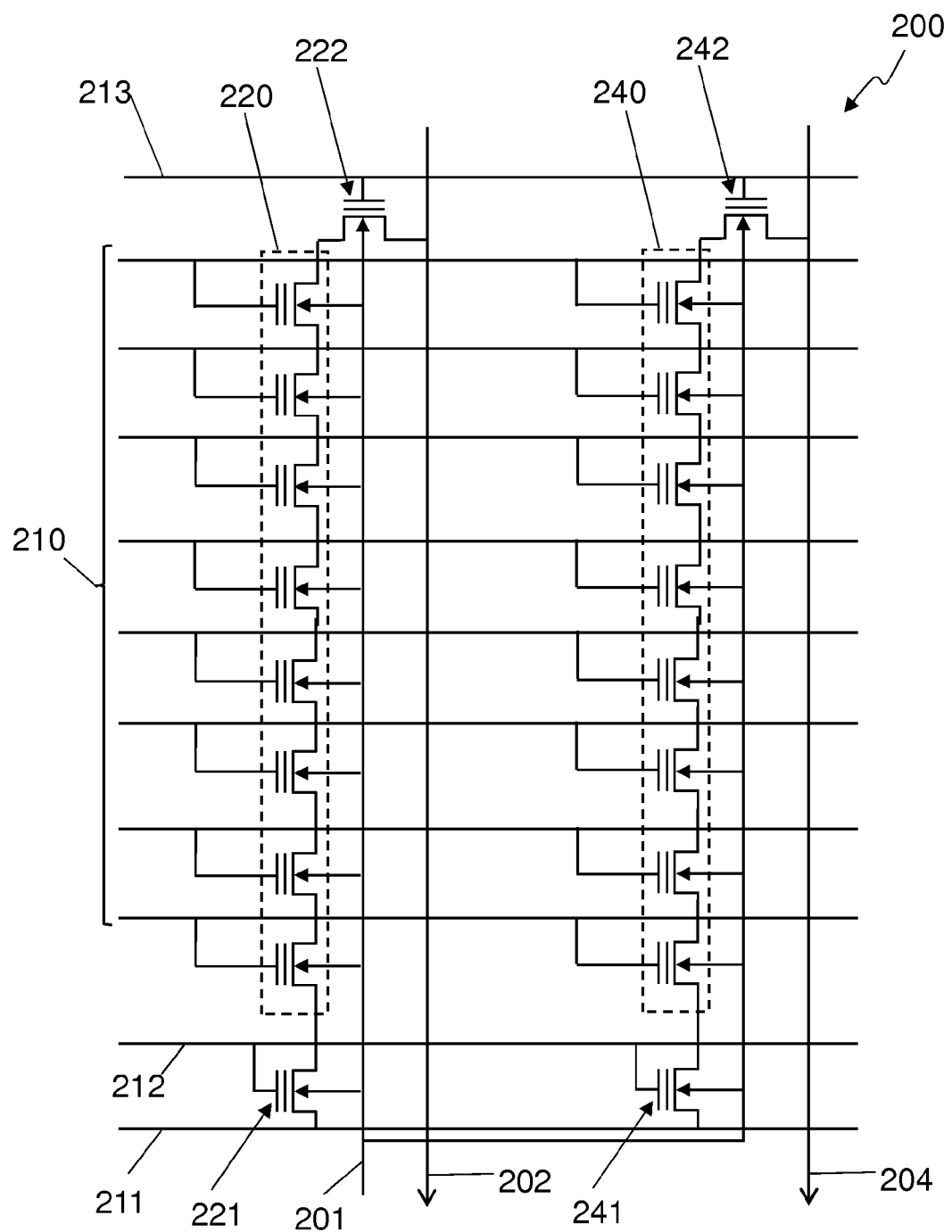
FIG. 2 is a schematic of a portion of a NAND flash device that uses flash cells as select gates.

FIG. 2 is a schematic of a portion of a NAND flash device 200 that uses flash cells as select gates. Some embodiments may utilize other architectures to organize the memory cells that may be different than a NAND architecture. The NAND flash device 200 may be the same as or similar to the NAND flash devices 100A-E described in FIG. 1A-E. The NAND flash device 200 shows two NAND strings 220, 240 in the same block of the NAND flash device 200. The NAND flash cells may be single level cells (SLC) that store a single binary bit of information by allowing for two different voltage thresholds, or may be multi-level cells (MLC) that allow multiple bits of binary information to be stored. As an example, a MLC that can be programmed to one of eight different voltage thresholds can store three binary bits of information. The cells of the NAND strings 220, 240 may be arranged in a two-dimensional (2D) fashion as shown in FIG. 1A-E, but some embodiments may have three-dimensional stacks of cells organized into NAND strings.

The first NAND string 220 is coupled to the source line 211 by SGS 221, which is a floating gate transistor (FGT) in the embodiment shown. The first NAND string 220 is coupled to the first bit line 202 by SGD 222, which is a floating gate transistor (FGT) in the embodiment shown. The second NAND string 240 is coupled to the source line 211 and the second bit line 204 by SGS 241 and SGD 242, which are also FGTs, respectively. The first NAND string 220 and the second NAND string 240 share common word lines 210. The two SGSs 221, 241 are controlled by a common source control line 212 and the two SGDs 222, 242 are controlled by a common drain control line 213. Both NAND strings 220, 240 share a common substrate 201. So due to the common control lines, the first NAND string 220 and the second NAND string 240 are controlled together, so they will both perform the same operation. But because they are coupled to different bit lines 202, 204, different data may be read from, or programmed into, the two NAND strings 220, 240.

Figure 3:
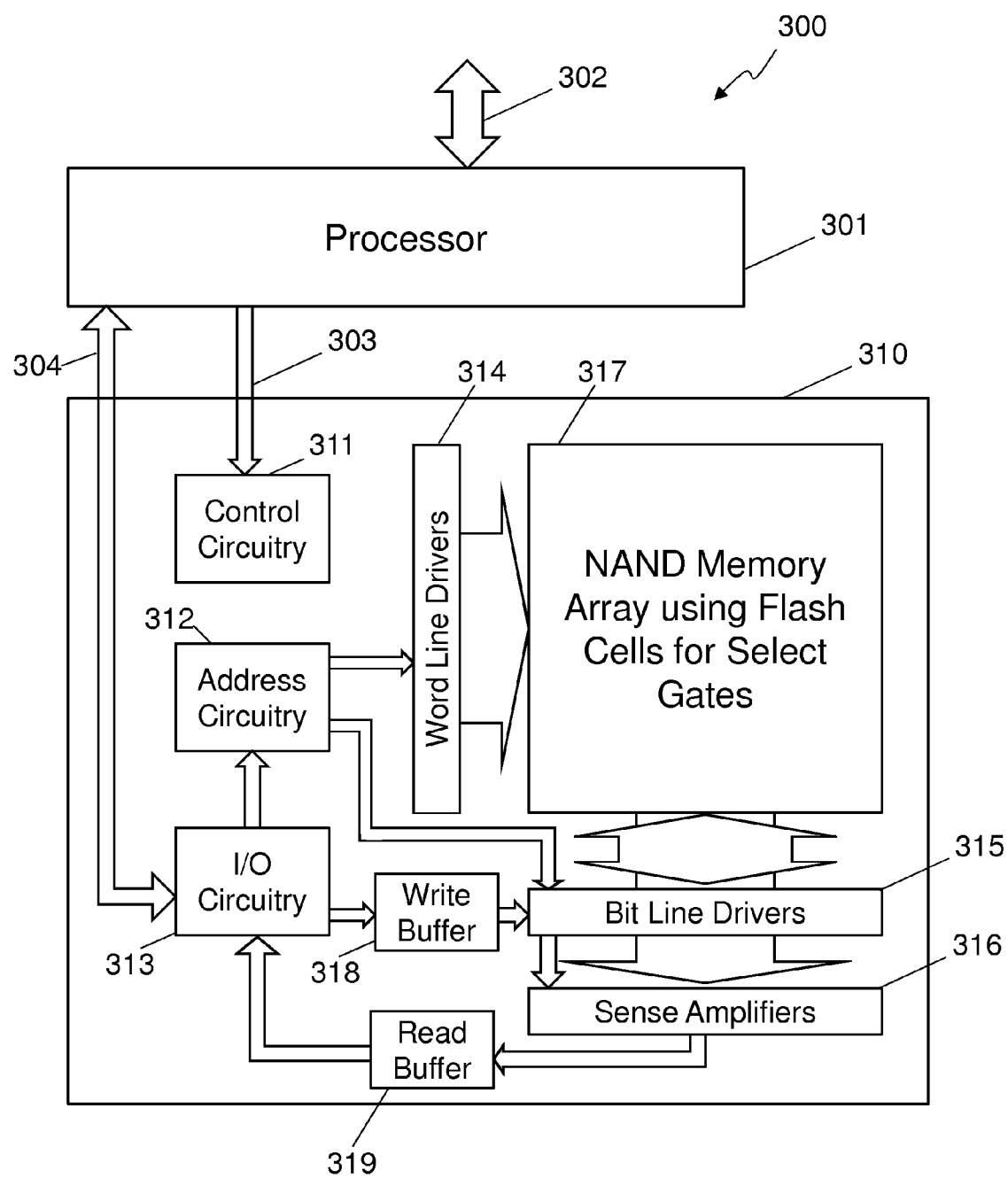
FIG. 3 is a block diagram of an electronic system including a NAND flash device that uses flash cells as select gates.

FIG. 3 is a block diagram of an electronic system 300 including a NAND flash device 310 that uses flash cells as select gates. Many different embodiments of the electronic system 300 are possible other than the embodiment shown, including using a single processor 301 to control multiple memory devices 310 to provide for more storage space, multiple processors 301 connected to memory devices 310, and systems including a variety of other functionality.

The processor 301 may be coupled to the memory device 310 with control lines 303 and data lines 304. In some embodiments data and control may utilize the same lines. The processor 301 may be an external microprocessor, microcontroller, or some other type of controlling circuitry, such as a flash controller. In some embodiments, the processor 301 may be integrated in the same package or even on the same die as the memory device 310. In some embodiments, the processor 301 may be integrated with the control circuitry 311, allowing some of the same circuitry to be used for both functions. The processor 301 may have external memory, such as RAM and ROM, used for program storage and intermediate data or it may have internal RAM or ROM. In some embodiments, the processor may use the memory device 310 for program or data storage. A program running on the processor 301 may implement many different functions including, but not limited to, an operating system, a standard file system, I/O drivers, and software applications. In at least one embodiment, the processor 301 may implement functions of a flash controller including, but not limited to, a flash file system, write leveling, bad cell or block mapping, error management and the method shown in FIG. 5. The storage system 300 has been simplified to focus on features that are helpful in understanding this disclosure.

In some embodiments an external connection 302 is provided. The external connection 302 is coupled to the processor 301 and allows the processor 301 to communicate to external devices. In some embodiments, circuitry external to the processor may be included to provide the external connection 302. If the electronic system 300 is a storage system, the external connection 302 may be used to provide an external device with non-volatile storage. The electronic system 300 may be a solid-state drive (SSD), a USB thumb drive, or any other type of storage system. The external connection 302 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If the electronic system 300 is a computing system, such as a mobile telephone, a tablet, a notebook computer, a set-top box, or some other type of computing system, the external connection 302 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), and protocols based on code division multiple access (CDMA) such as CDMA2000, and Long Term Evolution (LTE).

The memory device 310 includes an array 317 of memory cells organized in NAND strings using flash cells for select gates. The memory array 317 may be arranged in banks with word line rows and bit line columns. Address buffer circuitry 312 may be provided to latch address signals provided through the I/O circuitry 313. Address signals are received and decoded by word line drivers 314 and bit line drivers 315 to access the memory array 317. It may be appreciated by those skilled in the art, with the benefit of the present description that the number of address input connections depends on the density and architecture of the memory array 317. That is, the number of addresses increases with both increased memory cell counts and increased bank and block counts.

The memory device 310 may read data in the memory array 317 by sensing voltage or current changes in the memory array columns using sense amplifier circuitry 316. The sense amplifier circuitry 316, in one embodiment, is coupled to read and latch a row of data from the memory array 317. Write buffers 318 may be used in some embodiments to accumulate data until a write can be performed and read buffers 319 may hold data read from the memory array 317 until it can be sent out through the data lines 304. The I/O circuitry 313 routes the data through the external interface of the memory device 310.

The external leads of the memory device 310 coupled to the control lines 303 and/or the data line 304 may be the external interface of the memory device 310. The processor 301 may send various commands to the memory device 310 during normal operation though the external interface 303, 304 of the memory device, such as data read commands, data program commands, SG erase commands, SG program commands, block erase commands, and block program commands. In at least one embodiment, the processor 301 may be a flash memory controller, and may manage a flash device using a method as shown by the flowchart 500 in FIG. 5.

Memory control circuitry 311 may decode the commands sent from the processor 301 and may control the operations on the memory array 317, including data read operations, data program operations, SG erase operations, SG program operations, block erase operations, block program operations and SG voltage threshold check operations. The memory controller circuitry 311 may be a state machine, a sequencer, a processor, or some other type of controller to generate the voltage waveforms necessary to control the memory array 317. The control circuitry 311 communicates with the other blocks in the memory device but those connections are not shown as they would overly complicate the block diagram 300 and one skilled in the art can understand that the control circuitry 311 has numerous interconnections with the other blocks in order to control their functions. In at least one embodiment, the memory control circuitry 311 may manage flash cells using a method as shown by the flowchart 400 in FIG. 4.

The flowchart and/or block diagrams in the figures help to illustrate the architecture, functionality, and operation of possible implementations of systems, methods and computer program products of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 4:
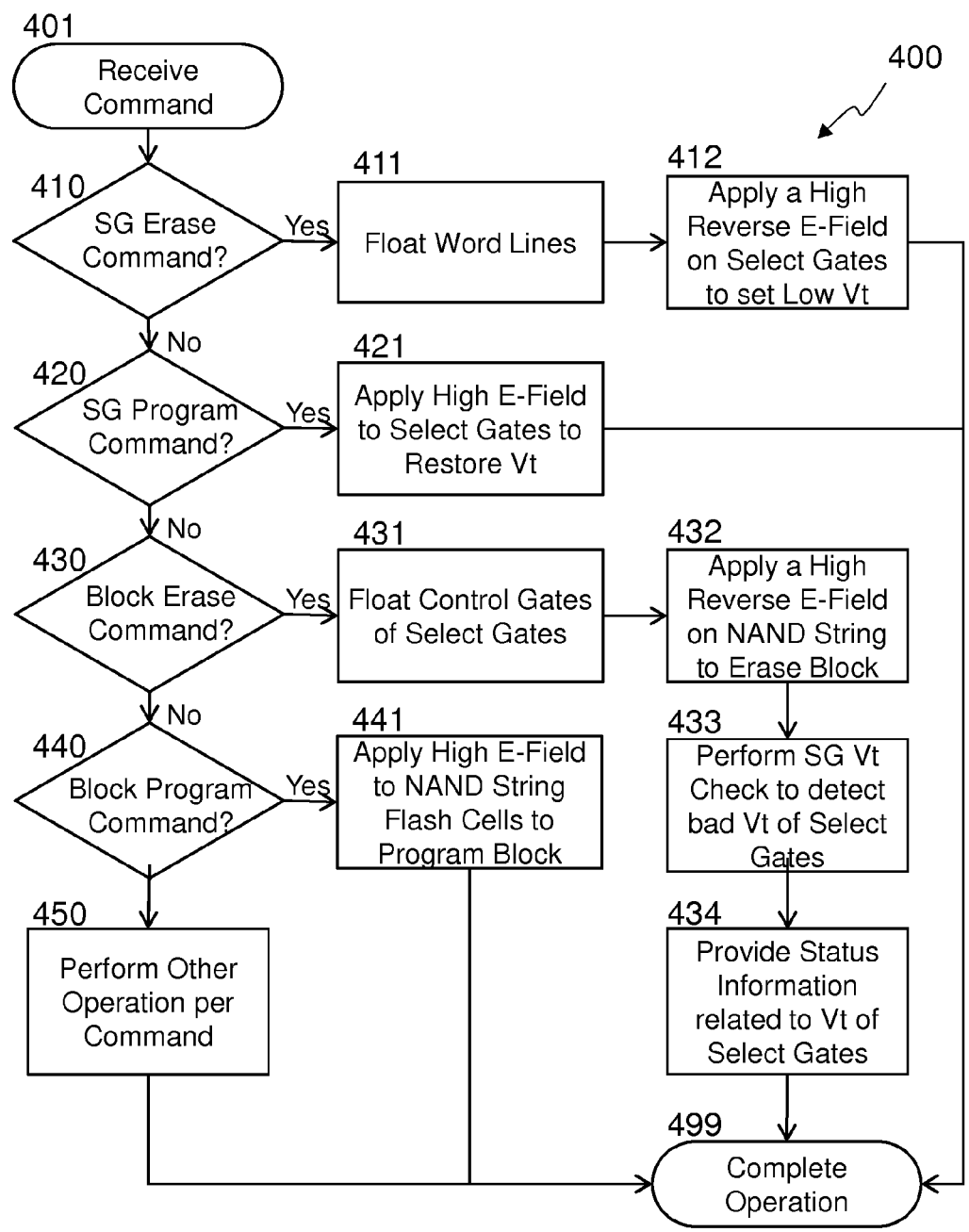
FIG. 4 is a flow chart of a method to manage flash cells used as select gates in a NAND flash device.

FIG. 4 is a flow chart 400 of a method to manage flash cells used as select gates in a NAND flash device. The NAND flash device may be similar to the devices described in FIGS. 1A-E and/or FIG. 2, and/or the memory device 310 of FIG. 3. A command may be received at block 401 during normal operation of the NAND flash device through the external interface. Block 410 may check to see if the command is a select gate erase command and the flash device may perform a select gate erase operation in response that command. One embodiment of the select gate erase operation is shown. The word lines of a NAND string may be floated at block 411 and a high reverse electric filed may be applied on the select gates coupled to that NAND string at block 412 which may set a low voltage threshold for those select gates, which are flash cells such as floating gate transistors. The select gate erase operation may be similar to that shown in FIG. 1A. The operation may be complete at block 499.

Block 420 may check to see if the command is a select gate program command and the flash device may perform a select gate program operation in response to that command. One embodiment of the select gate program operation is shown in block 421. Block 421 may apply a high electric field across the select gates to restore the voltage threshold to a specified value. The operation may be similar to that shown in FIG. 1B. The operation may be complete at block 499.

Block 430 may check to see if the command is a block erase command and the flash device may perform a block erase operation in response to that command. One embodiment of the block ease operation is shown. The control gates of the select gates of the block may be floated at block 431. At block 432 a high reverse electric field may be applied across the charge storage regions of the NAND strings in the block to erase the block which may be similar to the operation shown in FIG. 1C. In some embodiments, a block erase verify operation may be performed to ensure that the block is properly erased. A select gate voltage threshold check operation may be performed at block 433 to check the voltage threshold of the select gates of the block. The select gate voltage threshold check operation may be similar to that shown in FIG. 1D. At block 434, status information related to the voltage threshold of the select gates may be provided. The information may include information such as low select gate voltage if the select gate voltage is below a specified minimum, high select gate voltage if the select gate voltage is above a specified maximum, an indication of the voltage threshold being outside of a specified range if the select gate voltage is below the specified minimum or above the specified maximum, or an indication that the NAND string was not properly erased. Any of the failures listed may be reported as an erase failure. The operation may be complete at block 499.

Block 440 may check to see if the command is a block program command and the flash device may perform a block program operation in response to that command. One embodiment of the select gate program operation is shown in block 441. Block 441 may apply a high electric field across the charge storage regions of the NAND strings in a block to program the voltage thresholds to a value above 0 V. The operation may be similar to that shown in FIG. 1E. The operation may be complete at block 499. If some other command was received, the other operation is performed at block 450 and that operation may also be complete at block 499.

Figure 5:
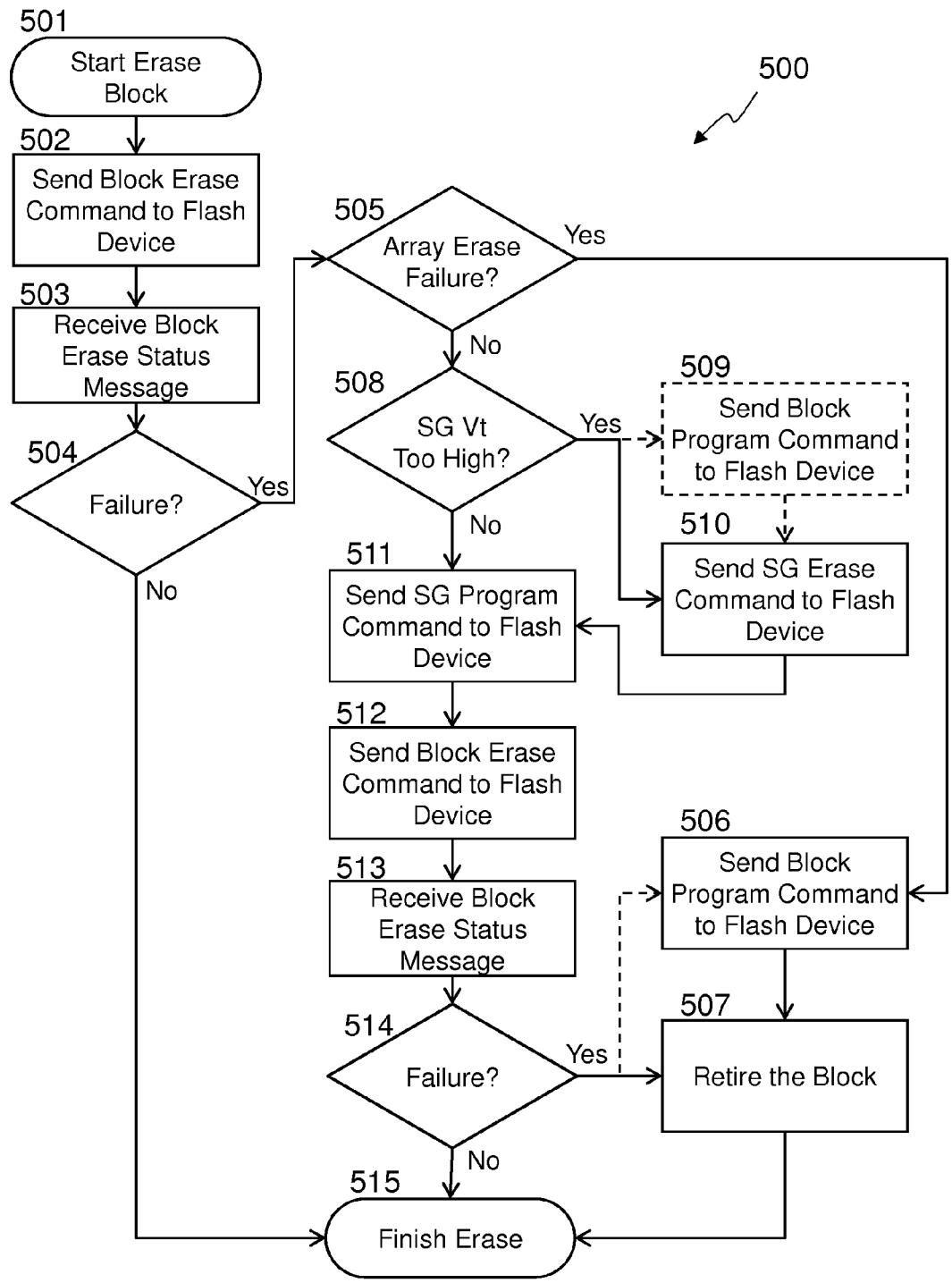
FIG. 5 is a flow chart of a method to manage a flash device that uses flash cells as select gates.

FIG. 5 is a flow chart 500 of a method to manage a flash device that uses flash cells as select gates. The method may be implemented in the processor 301 of FIG. 3, or in a special purpose flash controller, and be implemented in any combination of hardware and software elements. The method may start with a block erase being called for by the flash operating system or some other event at block 501. A block erase command may be sent to a flash device at block 502 and a block erase status message received at block 503. The block erase status message may be evaluated at block 504 and if no failure is reported, the erase is finished at block 515.

If a failure is reported the information of the block erase status message may be checked at block 505 to see if the failure is due to an array erase failure where one or more flash cells in the NAND strings of the block could not have their voltage thresholds set to a low enough value to be considered erased. If the failure is due to an array erase failure, a block program command may be sent to the flash device at block 506 and the block is retired at block 507 before the erase is finished at block 515.

If the erase failure is not due to an array erase failure, the block erase status message may be checked at block 508 to see if the select gate voltage threshold is too high. If the select gate voltage threshold is too high, some embodiments may send a block program command to the flash device at block 509. Other embodiments may skip block 509 as some embodiments of the flash device may program the block after a failure due to a bad select gate voltage threshold without receiving a block program command. There may be several reasons for ensuring that the cells of a block are programmed. If all the cells of the NAND string are erased and power would happen to be lost after the select gates were erased but before they were programmed, that NAND string would always be selected and it may not be possible to read critical information in other parts of the NAND device which may render the device inoperable. In many cases, one inoperable NAND device may render the entire electronic system inoperable. Also, if a block is retired, the select gates in that block may continue to see program drain disturbances which may eventually lower the voltage threshold of those select gates to a point that if the NAND string were erased, it may conduct and interfere with reading other NAND strings of the block.

At block 510 a select gate erase command may be sent to the flash device to lower the voltage threshold of the select gates. And then a select gate program command may be sent to the flash device at block 511. Block 511 may also be performed if the select gate voltage threshold is too low, or is outside of its specified range which may be defined as the voltage threshold being below a minimum specified value or above a maximum specified value.

Once the select gate program command has been completed, another block erase command may be sent to the flash device a block 512 and another block erase status message received at block 513. The message is checked to see if the block erase command failed at block 514 and if no failure occurred, the erase is finished at block 515. If a failure occurred, some embodiments may send a block program command to the flash device at block 506. The block is retired at block 507 and the erase if finished at block 515.

As will be appreciated by those of ordinary skill in the art, aspects of the various embodiments shown in the flowcharts and/or block diagrams may be embodied as a system, method or computer program product. Accordingly, aspects of various embodiments may take the form of an entirely hardware embodiment, an entirely software embodiment (including firmware, resident software, micro-code, or the like) or an embodiment combining software and hardware aspects that may all generally be referred to herein as a processor, computer, controller or system. Furthermore, aspects of the various embodiments may take the form of an article of manufacture, or a computer program product, embodied in one or more computer readable medium(s) having computer readable program code stored thereon.

Any combination of one or more computer readable storage medium(s) may be utilized. A computer readable storage medium may be embodied as, for example, an electronic, magnetic, optical, electromagnetic, infrared, or semiconductor system, apparatus, or device, or other like storage devices known to those of ordinary skill in the art, or any suitable combination of computer readable storage mediums described herein. In the context of this document, a computer readable storage medium may be any tangible medium that can contain, or store a program and/or data for use by or in connection with an instruction execution system, apparatus, or device.

Examples of various embodiments are described in the following paragraphs:

An example memory device may include two or more memory cells in an integrated circuit, at least one select gate coupled to the two or more memory cells, and an interface to accept a select gate erase command and a select gate program command during normal operation of the integrated circuit. The at least one select gate may be built with a flash cell. The integrated circuit may be capable to perform operations to erase the at least one select gate in response to the select gate erase command, and program the at least one select gate in response to the select gate program command. In some example memory devices the two or more memory cells are organized as a NAND string, and the at least one select gate includes a first flash cell and a second flash cell coupled to the NAND string at opposite ends. The first flash cell may function as a select gate source and the second flash cell may function as the select gate drain. In some example memory devices the at least one select gate and the two or more memory cells include floating gate field effect transistors. In some example memory devices the at least one select gate has a voltage threshold of about 0 volts or less after the select gate erase operation is performed, and a voltage threshold of greater than about 0 volts after the select gate program operation is performed. In some example memory devices the control gates of the two or more memory cells float during the select gate erase operation, and the state of the two or more memory cells are unchanged by the select gate erase operation. In some example memory devices the interface may further accept an erase command and to provide status information, and may be capable to perform an operation to erase the two or more memory cells in response to the erase command. In some example memory devices, the status information provided in response to a failed operation to erase the two or more memory cells includes information to indicate the cause of the failure, selected from a group consisting of a low select gate voltage threshold and a high select gate voltage threshold. Some example memory devices may be capable to perform an operation to program a block of memory cells, including the two of more memory cells, in response to the failed operation to erase the two or more memory cells, if the failure is selected from the group consisting of a low select gate voltage threshold and a high select gate voltage threshold. Some example memory devices may also include a block of memory cells including the two or more memory cells, and the interface may also accept a block program command and may be capable to perform an operation to program the block of memory cells. Any combination of the examples of this paragraph may be used in embodiments.

An example method to manage a memory device may include erasing flash cells used as select gates in a memory device in response to a select gate erase command received during normal operation of the memory device, and programming the flash cells used as the select gates in response to a select gate program command during normal operation of the memory device. A state of memory cells coupled to the select gates in the memory device may be unchanged by the erasing and the programming of the flash cells used as the select gates. Some methods may also include floating control gates of the memory cells during the erasing of the flash cells used as the select gates. Some methods may also include performing an erase operation to erase the memory cells in response to an erase command, and providing status information resulting from a failed erase operation that includes information related to a voltage threshold of the flash cells used as the select gates. In some example methods the status information related to the voltage threshold of the flash cells used as the select gates includes an indication that may include the voltage threshold below a first predetermined value, or the voltage threshold above a second predetermined value. Some methods may also include performing a program operation to program the memory cells in response to a program command during normal operation of the memory device. Any combination of the examples of this paragraph may be used in embodiments.

An example method to manage a memory device may include sending a select gate erase command to a memory device to erase select gates in a block of the memory device if an indication that a voltage threshold of the select gates is above a predetermined voltage level is received, sending a select gate program command to the memory device to program the select gates in the block of the memory device if a first indication that the voltage threshold of the select gates is outside of a predetermined voltage range is received, and retiring the block of the memory device if a second indication that the voltage threshold of the select gates is outside of the predetermined voltage range is received. The second indication may be received after the programming of the select gates. Some example methods may also include sending a first block erase command to the memory device, receiving a first block erase status message from the memory device in response to the first block erase command, sending a second block erase command to the memory device after the programming of the select gates, and receiving a second block erase status message from the memory device in response to the second block erase command. The first block erase status message may include one or more indication such as the voltage threshold of the select gates is above the predetermined voltage level, or the first indication that the voltage threshold of the select gates is outside of the predetermined voltage range. The second block erase status message may include the second indication that the voltage threshold of the select gates is outside of the predetermined voltage range. The select gates may be made with flash cells, and the memory device may include flash memory cells in a NAND architecture. Some example methods may include sending a first block erase command to the memory device, receiving a block erase status message from the memory device in response to the first block erase command, and retiring the block if block erase status message indicates that an array erase failure occurred. Some example methods may include sending a block program command to the memory device before the sending of the select gate erase command. Some example methods may include sending a block program command to the memory device, if the second indication that the voltage threshold of the select gates is outside of the predetermined voltage range is received. Any combination of the examples of this paragraph may be used in embodiments.

An example article of manufacture may include a non-transitory storage medium having instructions stored thereon that, if executed, result in sending a select gate erase command to a memory device to erase select gates in a block of the memory device if an indication that a voltage threshold of the select gates is above a predetermined voltage level is received, sending a select gate program command to the memory device to program the select gates in the block of the memory device if a first indication that the voltage threshold of the select gates is outside of a predetermined voltage range is received, and retiring the block of the memory device if a second indication that the voltage threshold of the select gates is outside of the predetermined voltage range is received, wherein the second indication is received after the programming of the select gates. Some example article of manufacture may also include instructions, that if executed, further result in sending a first block erase command to the memory device, receiving a first block erase status message from the memory device in response to the first block erase command, sending a second block erase command to the memory device after the programming of the select gates; receiving a second block erase status message from the memory device in response to the second block erase command. The first block erase status message may include one or more indication such as the voltage threshold of the select gates is above the predetermined voltage level, or the first indication that the voltage threshold of the select gates is outside of the predetermined voltage range. The second block erase status message may include the second indication that the voltage threshold of the select gates is outside of the predetermined voltage range; The select gates may be made with flash cells, and the memory device may include flash memory cells in a NAND architecture. Any combination of the examples of this paragraph may be used in embodiments.

An example integrated circuit may include a controller, and an external interface to couple to a memory device. The controller may be capable to send a block erase command to the memory device, receive a first block erase status message from the memory device, send a select gate erase command to the memory device to erase select gates in a block of the memory device if the first block erase status message indicates that a voltage threshold of the select gates is above a predetermined voltage level, send a select gate program command to the memory device to program the select gates in the block of the memory device if the first block erase status message indicates that the voltage threshold of the select gates is outside of a predetermined voltage range, send a second block erase command to the memory device after the select gate program command, receive a second block erase status message from the memory device, and retire the block of the memory device if the second block erase status message indicates that an erase failure occurred. In some example integrated circuits the controller may also be capable to retire the block of the memory device if the first block erase status message indicates that an array erase failure occurred. In some example integrated circuits the controller may also be capable to send a block program command to the memory device and then retire the block, if the first block erase status message indicates that an array erase failure occurred. In some example integrated circuits the controller may also be capable to send a block program command to the memory device before the select gate erase command is sent. In some example integrated circuits the controller may also be capable to send a block program command to the memory device, if the second block erase status message indicates that the voltage threshold of the select gates is outside of the predetermined voltage range. Any combination of the examples of this paragraph may be used in embodiments.

An example electronic system may include a memory device including two or more flash memory cells organized as a NAND string in a block of the memory device, and select gates coupled to the NAND string at opposite ends, wherein the select gates comprise flash cells. The example electronic system may also include a controller coupled to the memory device. The memory device may be capable to provide information related to a voltage threshold of the select gates to the controller, erase the select gates in response to a select gate erase command from the controller, and program the select gates in response to a select gate program command from the controller. The controller may be capable to send the select gate erase commend to the memory device if the information provided by the memory device indicates that the voltage threshold of at least one of the select gates is above a predetermined voltage level, and send the select gate program command to the memory device if the information provided by the memory device indicates that the voltage threshold of at least one of the select gates is outside of a predetermined voltage range. In some example electronic systems the memory device may also be capable to float control gates of the two or more flash memory cells during the erasing of the select gates, wherein the state of the NAND string is unchanged. In some example electronic systems the memory device may also be capable to perform an operation to erase the NAND string in response to a block erase command from the controller, and provide block erase status information that includes the information related to the voltage threshold of the select gates, to the controller in response to the block erase command. In some example electronic systems the controller may also be capable to send the block erase command to the memory device, receive the block erase status information, and retire the block of the memory device if the block erase status information includes an indication that the voltage threshold of at least one of the select gates is outside of the predetermined voltage range. In some example electronic systems the controller may also be capable to retire the block of the memory device if the block erase status information indicates that an array erase failure occurred. In some example electronic systems the memory device may also be capable to program the block of the memory device including the two of more flash memory cells in response to a block program command from the controller. In some example electronic systems the controller may also be capable to send a block program command to the memory device and then retire the block of the memory device, if the block erase status information indicates that an array erase failure occurred. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. An electronic system comprising:
   a memory device including two or more flash memory cells organized as a NAND string in a block of the memory device, and select gates coupled to the NAND string at opposite ends, wherein the select gates comprise flash cells;
   a controller coupled to the memory device;
   the memory device capable to:
      provide information related to a voltage threshold of the select gates to the controller;
      erase the select gates in response to a select gate erase command from the controller; and
      program the select gates in response to a select gate program command from the controller;
   the controller capable to:
      send the select gate erase commend to the memory device if the information provided by the memory device indicates that the voltage threshold of at least one of the select gates is above a predetermined voltage level; and
      send the select gate program command to the memory device if the information provided by the memory device indicates that the voltage threshold of at least one of the select gates is outside of a predetermined voltage range.

2. The electronic system of claim 1, the memory device further capable to:
   float control gates of the two or more flash memory cells during the erasing of the select gates, wherein the state of the NAND string is unchanged.

3. The electronic system of claim 1, the memory device further capable to:
   perform an operation to erase the NAND string in response to a block erase command from the controller; and
   provide block erase status information that includes the information related to the voltage threshold of the select gates, to the controller in response to the block erase command;
   the controller further capable to:
      send the block erase command to the memory device;
      receive the block erase status information; and retire the block of the memory device if the block erase status information includes an indication that the voltage threshold of at least one of the select gates is outside of the predetermined voltage range.

4. The electronic system of claim 3, the controller further capable to retire the block of the memory device if the block erase status information indicates that an array erase failure occurred.

5. The electronic system of claim 3, the memory device further capable to:
program the block of the memory device including the two of more flash memory cells in response to a block program command from the controller;
the controller further capable to:
send a block program command to the memory device and then retire the block of the memory device, if the block erase status information indicates that an array erase failure occurred.

6. A method to extend select gate lifetime for a memory device including two or more flash memory cells organized as a NAND string in a block of the memory device, the method comprising:
providing information related to a voltage threshold of the select gates to a controller coupled to the memory device;
erasing the select gates in response to a select gate erase command from the controller if the information provided by the memory device indicates that the voltage threshold of at least one of the select gates is above a predetermined voltage level; and
programming the select gates in response to a select gate program command from the controller if the information provided by the memory device indicates that the voltage threshold of at least one of the select gates is outside of a predetermined voltage range.

7. The method of claim 6, further comprising:
floating control gates of the two or more flash memory cells during the erasing of the select gates, wherein the state of the NAND string is unchanged.

8. The method of claim 6, further comprising:
performing an operation to erase the NAND string in response to a block erase command from the controller;
providing block erase status information that includes the information related to the voltage threshold of the select gates, to the controller in response to the block erase command; and
receiving the block erase command from the controller, wherein the controller retires the block of the memory device if the block erase status information includes an indication that the voltage threshold of at least one of the select gates is outside of the predetermined voltage range.

9. The method of claim 8, wherein the controller retires the block of the memory device if the block erase status information indicates that an array erase failure occurred.

10. The method of claim 8, further comprising:
programming the block of the memory device including the two of more flash memory cells in response to a block program command from the controller;
receiving a block program command from the controller and wherein the controller retires the block of the memory device if the block erase status information indicates that an array erase failure occurred.

11. An article of manufacture comprising a non-transitory medium having instructions stored thereon that, if executed, result in extending select gate lifetime for a memory device including two or more flash memory cells organized as a NAND string in a block of the memory device, by:
providing information related to a voltage threshold of the select gates to a controller coupled to the memory device;
erasing the select gates in response to a select gate erase command from the controller if the information provided by the memory device indicates that the voltage threshold of at least one of the select gates is above a predetermined voltage level; and
programming the select gates in response to a select gate program command from the controller if the information provided by the memory device indicates that the voltage threshold of at least one of the select gates is outside of a predetermined voltage range.

12. The article of manufacture of claim 11, wherein the instructions, if executed, further result in extending select gate lifetime for the memory device by:
floating control gates of the two or more flash memory cells during the erasing of the select gates, wherein the state of the NAND string is unchanged.

13. The article of manufacture of claim 11, wherein the instructions, if executed, further result in extending select gate lifetime for the memory device by:
performing an operation to erase the NAND string in response to a block erase command from the controller;
providing block erase status information that includes the information related to the voltage threshold of the select gates, to the controller in response to the block erase command; and
receiving the block erase command from the controller, wherein the controller retires the block of the memory device if the block erase status information includes an indication that the voltage threshold of at least one of the select gates is outside of the predetermined voltage range.

14. The article of manufacture of claim 13, wherein the controller retires the block of the memory device if the block erase status information indicates that an array erase failure occurred.

15. The article of manufacture of claim 13, wherein the instructions, if executed, further result in extending select gate lifetime for the memory device by:
programming the block of the memory device including the two of more flash memory cells in response to a block program command from the controller;
receiving a block program command from the controller and wherein the controller retires the block of the memory device if the block erase status information indicates that an array erase failure occurred.

* * * * *